United States Patent
Jiang et al.

(10) Patent No.: US 9,773,579 B2
(45) Date of Patent: Sep. 26, 2017

(54) SINGLE COMPONENT, LOW TEMPERATURE CURABLE POLYMERIC COMPOSITION AND RELATED METHOD

(75) Inventors: Hong Jiang, Irvine, CA (US); Aziz S. Shaikh, San Diego, CA (US)

(73) Assignee: HERAEUS PRECIOUS METALS NORTH AMERICA CONSHOHOCKEN LLC, West Conshohocken, PA (US)

( * ) Notice: Subject to any disclaimer, the term of this patent is extended or adjusted under 35 U.S.C. 154(b) by 403 days.

(21) Appl. No.: 13/877,713

(22) PCT Filed: Sep. 28, 2011

(86) PCT No.: PCT/US2011/053590
§ 371 (c)(1),
(2), (4) Date: Sep. 23, 2013

(87) PCT Pub. No.: WO2012/047690
PCT Pub. Date: Apr. 12, 2012

(65) Prior Publication Data
US 2014/0008112 A1    Jan. 9, 2014

Related U.S. Application Data

(60) Provisional application No. 61/389,888, filed on Oct. 5, 2010.

(51) Int. Cl.
| | |
|---|---|
| H01B 1/02 | (2006.01) |
| H01L 21/64 | (2006.01) |
| H01B 1/22 | (2006.01) |
| C08L 63/00 | (2006.01) |

(52) U.S. Cl.
CPC .............. H01B 1/02 (2013.01); H01B 1/22 (2013.01); H01L 21/64 (2013.01); C08L 63/00 (2013.01); *H01L 2924/0665* (2013.01)

(58) Field of Classification Search
None
See application file for complete search history.

(56) References Cited

U.S. PATENT DOCUMENTS

| | | | |
|---|---|---|---|
| 4,410,457 A * | 10/1983 | Fujimura et al. | 252/508 |
| 4,747,968 A * | 5/1988 | Gilleo | 252/514 |
| 5,047,376 A | 9/1991 | Baumann et al. | |
| 5,183,593 A * | 2/1993 | Durand et al. | 252/514 |
| 5,200,264 A | 4/1993 | Frentzel | |
| 5,830,389 A * | 11/1998 | Capote et al. | 252/512 |
| 6,740,193 B2 | 5/2004 | Woods et al. | |
| 2004/0198991 A1 | 10/2004 | Stone | |
| 2007/0213429 A1 | 9/2007 | Cheng et al. | |
| 2007/0249484 A1 | 10/2007 | Benkhoff et al. | |
| 2008/0161468 A1 | 7/2008 | Juikar et al. | |
| 2009/0127513 A1 | 5/2009 | Kroupa et al. | |
| 2010/0151138 A1* | 6/2010 | Occhiello et al. | 427/407.1 |
| 2010/0210745 A1* | 8/2010 | McDaniel et al. | 521/55 |

FOREIGN PATENT DOCUMENTS

| | | |
|---|---|---|
| JP | 5-155982 A | 6/1993 |
| JP | 8-48754 A | 2/1996 |
| JP | 2002-161123 A | 6/2002 |
| WO | WO-2010048387 A1 | 4/2010 |

OTHER PUBLICATIONS

Zhou et al. ("One-Component, Low-Temperature, and Fast Cure Epoxy Encapsulant with High Refractive Index for LED Applications" IEEE Transactions on Advanced Packaging, vol. 31, No. 3, Aug. 2008, pp. 484-489).*
English text translation of Morishima et al. (JP 2002-161123 A), accessed on the JPO AIPN website and attached as a PDF, pp. 1-5.*
International Search Report; International Application No. PCT/US2011/053590; International Filing Date: Sep. 28, 2011; 2 pages.

* cited by examiner

*Primary Examiner* — Katie L Hammer
(74) *Attorney, Agent, or Firm* — Blank Rome LLP

(57) ABSTRACT

Electrically conductive polymeric compositions curable at temperatures below 250° C. are disclosed. The compositions are particularly well suited for forming electrodes used in association with certain solar cells.

19 Claims, No Drawings

SINGLE COMPONENT, LOW TEMPERATURE CURABLE POLYMERIC COMPOSITION AND RELATED METHOD

FIELD OF THE INVENTION

The present invention relates to electrically conductive, heat curable polymeric compositions. The compositions find wide use in association with forming solar cells and particularly, electrical contacts for use in solar cells.

BACKGROUND OF THE INVENTION

Silver pastes used for making photovoltaic cells that are based on crystalline silicon, require high temperature processes. At firing temperatures greater than 700° C., Ag electrodes are formed on crystalline Si wafers with low contact resistance. With Si:H-based solar cells however, the processing temperature can not exceed 250° C., in order to avoid degrading the heat sensitive material in such solar cells. Accordingly, a need exists for improved compositions and methods for forming silver electrodes at temperatures less than 250° C.

Firing operations consume relatively large amounts of energy. And in many instances, firing constitutes a primary limitation in manufacturing solar cells due to the lengthy time periods typically required. Therefore, it would also be beneficial to provide an electrically conductive composition that was heat curable at temperatures less than 250° C. in a relatively short time period.

SUMMARY OF THE INVENTION

The difficulties and drawbacks associated with previously known compositions, electrical contacts formed therefrom, and related methods are addressed in the present compositions, contacts and methods.

In one aspect, the present invention provides a single component, low temperature curable polymeric composition comprising from about 5% to about 25% of at least one alicyclic epoxy resin, from about 0.05% to about 1% of a primary catalyst, from about 0.5% to about 10% of a blocked isocyanate, from about 0% to about 0.5% of a secondary catalyst, from about 0% to about 4% of one or more low viscosity diluents, from about 0% to about 15% of one or more toughening agents, and from about 40% to about 90% of conductive filler.

In another aspect, the present invention provides a method of forming an electrical contact for a solar cell. The method comprises providing a single component, low temperature curable polymeric composition comprising from about 5% to about 25% of at least one alicyclic epoxy resin, from about 0.05% to about 1% of a primary catalyst, from about 0.5% to about 10% of a blocked isocyanate, from about 0% to about 0.5% of a secondary catalyst, from about 0% to about 4% of one or more low viscosity diluents, from about 0% to about 15% of one or more toughening agents, and from about 40% to about 90% of conductive filler. The method also comprises depositing an effective amount of the composition on a substrate. And, the method further comprises heating the composition to a temperature of from about 70° C. to about 250° C. for a time period of from about 1 minute to about 10 minutes, to thereby form the electrical contact.

In still a further aspect, the present invention provides an electrically conductive contact formed from a composition comprising, prior to firing, from about 5% to about 25% of at least one alicyclic epoxy resin, from about 0.05% to about 1% of a primary catalyst, from about 0.5% to about 10% of a blocked isocyanate, from about 0% to about 0.5% of a secondary catalyst, from about 0% to about 4% of at least one low viscosity diluent, from about 0% to about 15% of at least one toughening agent, and from about 40% to about 90% of conductive filler.

As will be realized, the invention is capable of other and different embodiments and its several details are capable of modifications in various respects, all without departing from the invention. Accordingly, the description is to be regarded as illustrative and not restrictive.

DETAILED DESCRIPTION OF THE EMBODIMENTS

The present invention provides a single component, low temperature curable paste composition that comprises electrically conductive filler material such as silver flakes, an alicyclic epoxy resin, a cationic curing agent, and a blocked isocyanate that can be cured within a short period of time and at low temperatures to thereby provide a polymeric composition which exhibits good electrical conductivity.

The invention also provides electrically conductive electrodes that are formed at temperatures less than 250° C. by use of the preferred embodiment pastes. The electrodes are preferably silver or silver-based electrodes. The paste is heat curable at temperatures greater than 70° C., but lower than 250° C. in 10 minutes or less, such as about 2 minutes.

The present invention also provides various methods using the noted compositions. In particular, the invention provides methods of forming electrical contacts by subjecting the noted compositions to certain firing operations.

The preferred embodiment pastes can be used in a wide range of applications, and are primarily for use in forming thin film solar cells. The pastes are particularly well suited for use in forming Si:H-based solar cells. In addition to thin film solar cells, the present invention can also be used in association with other heat sensitive substrate surfaces as well.

The preferred embodiment compositions exhibit all or most of the following properties: a) good dispensability, b) good electrical conductivity, c) fast curing at temperatures less than 250° C. in less than 10 minutes, d) long room temperature pot life, and e) good adhesion to solder ribbons. Certain competitive materials may possess a few but not most or all these desirable properties.

As noted, electrical contacts, electrodes, or conductors (generally collectively referred to herein as "contacts") exhibit good electrical conductivity. Restated, electrical contacts formed from the compositions described herein exhibit relatively low electrical resistivity values. Preferably, electrical contacts formed as described herein exhibit an electrical resistivity of less than 0.01 ohm·cm, more preferably less than 0.001 ohm·cm, and most preferably less than 0.0008 ohm·cm.

Generally, the preferred embodiment compositions comprise from about 5% to about 25% of at least one alicyclic epoxy resin, from about 0.05% to about 1% of a primary catalyst, from about 0.5% to about 10% of a blocked isocyanate, from about 0% to about 0.5% of a secondary catalyst, from about 0% to about 4% of at least one low viscosity diluent, from about 0% to about 15% of at least one toughening agent, and from about 40% to about 90% of electrically conductive filler. The one or more low viscosity diluents can be for example, glycidyl ethers, glycol ether, glycol ether esters and glycol ether ketones, and combinations thereof. A preferred example of a low viscosity diluent is neopentyl glycol diglycidyl ether. The low viscosity diluents are not limited to any of these agents. Instead, the invention includes the use of any agent or combination of agents that reduces the viscosity of the composition. The one or more tougheners are used to increase or promote the toughness or durability of the composition, particularly after curing. Non-limiting examples of tougheners include but are not limited to aliphatic polyester diols, modified butadiene polymers, modified butadiene-acrylonitrile polymers, modified carboxy terminated butadiene acrylonitrile copolymers, adducts of epoxy resins and dimer acids, and combinations thereof.

The preferred embodiment compositions prior to firing, generally comprise (i) an alicyclic epoxy resin, (ii) a primary catalyst, (iii) one or more blocked isocyanates, (iv) an optional secondary catalyst, (v) one or more optional gylcidyl ethers, (vi) optional neopentyl glycol diglycidyl ether or similar agent, (vii) one or more optional aliphatic polyester diols, and (viii) metal flake which is preferably silver flake.

Typical and preferred concentrations for the various preferred embodiment compositions according to the present invention are set forth below in Table 1. All percentages are by weight and are based upon the total weight of the composition prior to firing.

TABLE 1

Typical and Preferred Compositions

| Typical Weight % Concentration | Preferred Weight % Concentration | Component |
|---|---|---|
| 5-25 | 12-18 | Alicyclic epoxy resin |
| 0.05-1 | 0.1-0.4 | Primary catalyst |
| 0.5-10 | 1-3 | Blocked isocyanate |
| 0-0.5 | 0-0.2 | Secondary catalyst |
| 0-2 | 0-1 | Glycidyl ether |
| 0-1 | 0-0.5 | Neopentyl glycol diglycidyl ether |
| 0-15 | 0-6 | Aliphatic polyester diol |
| 40-90 | 50-80 | Conductive filler |

The alicyclic epoxy resin is preferably a liquid, low viscous, cycloaliphatic epoxy resin having an epoxy equivalent weight of from about 100 to about 150, and preferably from about 130 to about 145. An example of a preferred alicyclic epoxy resin is ARALDITE CY179 available from Huntsman Advanced Materials of Woodlands, Tex. The alicyclic epoxy resin is typically used at a concentration of from about 5% to about 25%, and preferably from about 12% to about 18%.

The primary catalyst is preferably an antimony hexafluoride-based catalyst. Such a catalyst is commercially available from King Industries of Norwalk, Conn. under the designation CXC1612. The primary catalyst is typically used in a concentration of from about 0.05% to about 1.0%, and preferably from about 0.1% to about 0.4%.

The preferred embodiment compositions also comprise a blocked isocyanate. Preferably, the blocked isocyanate has an isocyanate equivalent weight of from about 450 to about 500, with about 475 being preferred. An example of a preferred blocked isocyanate is BI7963 available from Baxenden Chemicals, Ltd. of Lancashire, United Kingdom. BI7963 is a blocked isocyanate with an isocyanate equivalent weight of about 477. Blocked isocyanates with deblocking temperatures below 250° C. are suitable. The blocked isocyanate is typically used at a concentration of from about 0.5% to about 10%, and preferably from about 1% to about 3%.

The preferred compositions may also comprise one or more optional secondary catalysts. A preferred secondary catalyst is dibutyl tin dilaurate. This compound is commercially available from several sources such as Rhein Chemie Rheinau GmbH of Chardon, Ohio under the designation ADDOCAT 201. The secondary catalyst is optional and can be used at a concentration of from about 0 to about 0.5% and preferably from about 0 to about 0.2%.

The preferred compositions may also optionally comprise glycidyl ether. This component serves as a low viscosity diluent. A preferred glycidyl ether is available from CVC Specialty Chemicals, Inc. of Morristown, N.J. under the designation ERYSIS GE8. A preferred glycidyl ether is a $C_{12}$ to $C_{14}$ glycidyl ether having an epoxy equivalent weight of from about 250 to about 325, and preferably from about 275 to about 300. Typically, the concentration of the glycidyl ether component is from 0 to about 2%, with a preferred concentration range of 0 to about 1%.

The preferred embodiment compositions may also optionally comprise neopentyl glycol diglycidyl ether. This component serves as a low viscosity diluent. A preferred component is available from CVC Specialty Chemicals under the designation ERYSIS GE-20. The neopentyl glycol diglycidyl ether has an epoxy equivalent weight of from about 100 to about 150, and preferably from about 120 to about 140. The concentration of the neopentyl glycol diglycidyl ether is typically from 0 to about 1% and preferably from 0 to about 0.5%.

The preferred compositions may also optionally comprise an aliphatic polyester diol which is available from King Industries under the designation CDR-3315. It will be appreciated that this component serves as a toughening agent. The diol component is typically used in the composition in a concentration of from 0 to about 15%, and preferably from 0 to about 6%.

The preferred compositions additionally comprise one or more electrically conductive filler materials or "conductive filler" as sometimes referred to herein. The filler material is preferably in particle form. Preferably, the electrically conductive material(s) are metals in their elemental form and most preferably metals such as silver. The concentration of the electrically conductive material(s) is typically from about 40% to about 90%, and preferably from about 50% to about 80%. An example of a commercially available silver flake is Silver Flake 80 from Ferro Corporation of South Plainfield, N.J. The electrically conductive particles may exist in a wide array of shapes and sizes. Generally however, a flake form is preferred. Furthermore, the electrically conductive particles may be provided in the form of multiple classes of sizes or types of materials. For example, in a preferred aspect, a combination of two different grades of silver flake may be used, such as for example Ferro Silver Flake 80 and Ferro Silver Flake 9AI.

In certain applications, it is preferred to use coated particles such as silver coated copper particles. The electrically conductive filler material, when based upon composite particles, can include a wide range of material combinations. For example, electrically conductive composite particles can be selected from the group consisting of silver coated glass particles, silver coated copper particles, silver coated nickel particles, silver coated graphite particles, nickel coated graphite particles, gold coated glass particles, and combinations of these. When using composite particles, it is preferred to utilize composite particles including silver as the outer layer and one or more other materials within the interior of the particle. Examples of such materials for the interior include but are not limited to glass, graphite, copper, nickel, and combinations thereof. Materials in addition to or instead of silver can be used for the outer layer such as but not limited to nickel, gold, and combinations thereof. It will be appreciated that the composite particles comprise two or more materials and only the material disposed on the exterior of the particle, and hence constituting the outer material, needs to be electrically conductive. Thus, one or more materials of such composite particles disposed within the interior of the particle, can be generally electrically nonconductive such as glass. It will be understood that in no way is the invention limited to any of the noted combinations of materials for composite particles. Instead, the present invention includes nearly any combination of materials for the electrically conductive filler material.

In addition to the use of an alicyclic epoxy resin, epoxy resins that can be polymerized via cationic mechanism may also be suitable. A wide array of catalysts for cationic epoxy polymerization are thus also used. Catalysts for isocyanates are optional, but nearly any catalyst for isocyanates can be used.

Toughners, rheology modifiers, adhesion promoters, surfactants etc. are optional but can be used in the system.

The present invention also provides methods of forming electrical contacts. The electrical contacts are particularly well suited for use in solar cells. The methods generally comprise providing a single component, low temperature curable polymeric composition as described herein. The methods also comprise depositing an effective amount of the composition on a substrate. And, the methods then comprise heating the composition to a temperature within a range of from about 70° to about 250° C. for a time period of from about 1 minute to about 10 minutes to thereby form one or more electrical contacts. For certain compositions, the heating is performed for a time period of from about 4 minutes to about 6 minutes.

The present invention also provides electrical contacts formed from the preferred embodiment compositions described herein. As noted, the compositions are fired as described herein.

EXAMPLES

Various preferred embodiment pastes were prepared and subsequently cured and subjected to electrical resistivity measurements and adhesion strength tests.

Table 2 set forth below lists several preferred embodiment compositions according to the present invention.

TABLE 2

Preferred Compositions (in Weight %)

| Components | Example 1 | Example 2 | Example 3 | Example 4 |
|---|---|---|---|---|
| ARALDITE CY179 | 17.5 | 16.5 | 14 | 14 |
| CXC1612 | 0.25 | 0.24 | 0.2 | 0.2 |
| BI7963 | 3 | 3 | 1 | 1 |
| ADDOCAT 201 | 0.18 | 0.18 | 0 | 0.06 |
| ERYSIS GE8 | 0 | 1 | 1 | 0 |
| ERYSIS GE-20 | 0 | 0 | 0 | 0.5 |
| CDR-3315 | 0 | 0 | 5 | 5.31 |

TABLE 2-continued

Preferred Compositions (in Weight %)

| Components | Example 1 | Example 2 | Example 3 | Example 4 |
|---|---|---|---|---|
| Silver flake 80 | 79.07 | 79.08 | 78.8 | 50 |
| Silver flake 9Al | 0 | 0 | 0 | 28.93 |

ARALDITE CY179 is from Huntsman Advanced Materials of Salt Lake City, UT and is an alicyclic low viscosity liquid epoxy resin with epoxy equivalent weight of from about 131 to about 143.
CXC1612 is from King Industries of Norwalk, CT and it is an antimony hexafluoride based catalyst.
BI7963 is from Baxenden Chemicals Ltd. of Lancashire, UK and is a blocked isocyanate with an isocyanate equivalent weight of 477.
ADDOCAT 201 is from Rhein Chemie Rheinau GmbH of Chardon, OH and it is dibutyl tin dilaurate.
ERYSIS GE8 is from CVC Specialty Chemicals Inc. of Moorestown, NJ. This component is $C_{12}$-$C_{14}$ glycidyl ether with an epoxy equivalent weight of from about 275 to about 300.
ERYSIS GE-20 is from CVC Specialty Chemicals Inc. This component is neopentyl glycol diglycidyl ether with an epoxy equivalent weight of from about 125 to about 137.
CDR-3315 is from King Industries and it is an aliphatic polyester diol.
Silver flake 80 is from Ferro of South Plainfield, NJ.
Silver flake 9AI is from Ferro of South Plainfield, NJ.

The various compositions were prepared as follows. CXC1612 was first mixed in with ARALDITE CY179 until the solution turned clear. The remainder of the non-silver components were added one by one and mixed in between each addition. Silver flake was added to the resin mixture, followed by mixing and optional milling.

Sample preparation for volume resistivity measurement was performed as follows. A volume resistivity test pattern was printed onto a glass substrate, followed by curing at 180° C. in air for 5 minutes. Table 3 lists electrical resistivity values taken of samples in Examples 1-4.

TABLE 3

Electrical Resistivity of Examples 1 through 4

| | Example 1 | Example 2 | Example 3 | Example 4 |
|---|---|---|---|---|
| Resistivity ($\Omega \cdot cm$) | 0.00049 | 0.00021 | 0.00026 | 0.00019 |

Sample preparation for testing adhesion to solder ribbons was performed as follows. Effective amounts of the paste composition were deposited on indium tin oxide (ITO) coated substrates. Next, solder ribbons were positioned in the paste. Two ribbon compositions were used in these investigations. One ribbon was formed from 96.5% Sn and 3.5% Ag, and the other ribbon was formed from 62% Sn, 36% Pb, and 2% Ag. Next, the assemblies were cured at 180° C. for 5 minutes. Adhesion was measured by peeling the ribbon from the cured paste at 45°.

The results of adhesion tests are set forth below in Table 4.

TABLE 4

Adhesion Results

| | Example 1 | Example 2 | Example 3 | Example 4 |
|---|---|---|---|---|
| Adhesion to 96.5Sn/3.5Ag ribbon (N) | 2.2 | 2.6 | 1.8 | 2.2 |
| Failure mode | Cohesive | Cohesive | Cohesive | Cohesive |
| Adhesion to 62Sn/36Pb/2Ag ribbon (N) | 2.2 | 2.1 | 1.9 | 2.1 |
| Failure mode | Cohesive | Cohesive | Cohesive | Cohesive |

Many other benefits will no doubt become apparent from future application and development of this technology.

All patents, published applications, and articles noted herein are hereby incorporated by reference in their entirety.

It will be understood that any one or more feature or component of one embodiment described herein can be combined with one or more other features or components of another embodiment. Thus, the present invention includes any and all combinations of components or features of the embodiments described herein.

As described hereinabove, the present invention solves many problems associated with previously known compositions, methods, and associated devices. However, it will be appreciated that various changes in the details, materials and arrangements of components and operations, which have been herein described and illustrated in order to explain the nature of the invention, may be made by those skilled in the art without departing from the principle and scope of the invention, as expressed in the appended claims.

What is claimed is:

1. A single component, low temperature curable, electrically conductive polymeric composition comprising:
   from about 5% to about 25% of at least one alicyclic epoxy resin;
   from about 0.05% to about 1% of a primary catalyst, wherein the primary catalyst is an antimony hexafluoride-based catalyst;
   from about 0.5% to about 10% of a blocked isocyanate;
   from about 0% to about 0.5% of a secondary catalyst;
   from about 0% to about 4% of at least one low viscosity diluent;
   from about 0% to about 15% of a toughening agent; and
   from about 40% to about 90% of conductive filler comprising silver.

2. The single component, low temperature curable, electrically conductive polymeric composition of claim 1 wherein the conductive filler is silver flake.

3. The single component, low temperature curable, electrically conductive polymeric composition of claim 2 wherein the optional low viscosity diluent comprises glycidyl ether and neopentyl glycol diglycidyl ether, and the optional toughening agent comprises an aliphatic polyester diol, the polymeric composition comprising:
   from about 12% to about 18% of the at least one alicyclic epoxy resin;
   from about 0.05% to about 0.4% of the primary catalyst;
   from about 1% to about 3% of the blocked isocyanate;
   from about 0% to about 0.2% of the secondary catalyst;
   from about 0% to about 1% of glycidyl ether;
   from about 0% to about 0.5% of neopentyl glycidyl ether;
   from about 0% to about 6% of an aliphatic polyester diol; and
   from about 50% to about 80% of silver flake as the conductive filler.

4. The single component, low temperature curable, electrically conductive polymeric composition of claim 2 wherein the alicyclic epoxy resin is a cycloaliphatic epoxy resin having an epoxy equivalent weight of from about 100 to about 150.

5. The single component, low temperature curable, electrically conductive polymeric composition of claim 2 wherein the blocked isocyanate has an isocyanate equivalent weight of from about 450 to about 500.

6. The single component, low temperature curable, electrically conductive polymeric composition of claim 2 wherein the secondary catalyst is dibutyltin dilaurate.

7. The single component, low temperature curable, electrically conductive polymeric composition of claim 3 wherein the glycidyl ether is a $C_{12}$ to $C_{14}$ glycidyl ether having an epoxy equivalent weight of from about 250 to about 325.

8. The single component, low temperature curable, electrically conductive polymeric composition of claim 3 wherein the neopentyl glycol diglycidyl ether has an epoxy equivalent weight of from about 100 to about 150.

9. The single component, low temperature curable, electrically conductive polymeric composition of claim 2 wherein the at least one low viscosity diluent is selected from the group consisting of glycidyl ethers, glycol ether, glycol ether esters, glycol ether ketones, and combinations thereof.

10. The single component, low temperature curable, electrically conductive polymeric composition of claim 2 wherein the toughening agent is selected from the group consisting of aliphatic polyester diols, modified butadiene polymers, modified butadiene-acrylonitrile polymers, modified carboxy terminated butadiene acrylonitrile copolymers, adducts of epoxy resins and dimer acids, and combinations thereof.

11. The single component, low temperature curable, electrically conductive polymeric composition of claim 1 wherein the conductive filler includes electrically conductive composite particles.

12. The single component, low temperature curable, electrically conductive polymeric composition of claim 11 wherein the electrically conductive composite particles include an outer layer of silver.

13. The single component, low temperature curable, electrically conductive polymeric composition of claim 11 wherein the composite particles are selected from the group consisting of silver coated glass particles, silver coated copper particles, silver coated nickel particles, silver coated graphite particles, nickel coated graphite particles, gold coated glass particles and combinations thereof.

14. A method of forming an electrical contact for a solar cell, the method comprising:
   providing a single component, low temperature curable, electrically conductive polymeric composition comprising from about 5% to about 25% of at least one alicyclic epoxy resin, from about 0.05% to about 1% of a primary, wherein the primary catalyst is an antimony hexafluoride-based catalyst, from about 0.5% to about 10% of a blocked isocyanate, from about 0% to about 0.5% of a secondary catalyst, from about 0% to about 4% of at least one low viscosity diluent, from about 15% of a toughening agent, and from about 40% to about 90% of conductive filler comprising silver;
   depositing an effective amount of the composition on a substrate; and
   heating the composition to a temperature of from about 70° C. to about 250° C. for a time period of from about 1 minute to about 10 minutes, to thereby form the electrical contact.

15. The method of claim 14 wherein the conductive filler is silver flake.

16. An electrode formed from a single component, low temperature curable, electrically conductive polymeric composition comprising, prior to firing:
   from about 5% to about 25% of at least one alicyclic epoxy resin;
   from about 0.05% to about 1% of a primary catalyst, where in the primary catalyst is an antimony hexafluoride-based catalyst;
   from about 0.5% to about 10% of a blocked isocyanate;
   from about 0% to about 0.5% of a secondary catalyst;

from about 0% to about 4% of at least one low viscosity diluent;

from about 0% to about 15% of a toughening agent; and from about 40% to about 90% of conductive filler comprising silver.

17. The electrode of claim 16 wherein the conductive filler is silver flake.

18. The electrode of claim 16, wherein the optional low viscosity diluent comprises glycidyl ether and neopentyl glycol diglycidyl ether and the optional toughening agent comprises an aliphatic polyester diol; the composition comprising, prior to firing:

from about 12% to about 18% of the at least one alicyclic epoxy resin;

from about 0.01% to about 0.4% of the primary catalyst;

from about 1% to about 3% of the blocked isocyanate;

from about 0% to about 0.2% of the secondary catalyst;

from about 0% to about 1% of glycidyl ether;

from about 0% to about 0.5% of neopentyl glycol diglycidyl ether;

from about 0% to about 6% of an aliphatic polyester diol; and from about 50% to about 80% of silver flake as the conductive filler.

19. The single component, low temperature curable, electrically conductive polymeric composition of claim 1, wherein the composition is a paste.

\* \* \* \* \*